(12) United States Patent
Lancaster

(10) Patent No.: US 10,205,307 B2
(45) Date of Patent: Feb. 12, 2019

(54) POWER LINE MAINTENANCE MONITORING

(75) Inventor: Mark Lancaster, Brooks, GA (US)

(73) Assignee: Southwire Company, LLC, Carrollton, GA (US)

( * ) Notice: Subject to any disclaimer, the term of this patent is extended or adjusted under 35 U.S.C. 154(b) by 719 days.

(21) Appl. No.: 13/545,087

(22) Filed: Jul. 10, 2012

(65) Prior Publication Data

US 2012/0278011 A1    Nov. 1, 2012

Related U.S. Application Data

(63) Continuation-in-part of application No. 12/729,319, filed on Mar. 23, 2010.

(51) Int. Cl.
*H02G 7/02* (2006.01)
*H02G 1/02* (2006.01)
(Continued)

(52) U.S. Cl.
CPC ........... *H02G 1/02* (2013.01); *H02J 13/0006* (2013.01); *G01C 9/00* (2013.01); *G01R 15/142* (2013.01);
(Continued)

(58) Field of Classification Search
CPC .. H02G 7/02; H02G 1/04; H02G 7/04; H02G 1/02; H02G 7/20; G01N 2291/02854; G01N 2291/042; G01N 2291/0421; G01N 29/07; G01N 29/348; G01N 29/4454; G01B 17/04; G01B 21/00; G01C 9/00; G01C 15/002; G01L 5/103; G01L 5/047; G01L 5/101; G01L 5/102; Y02E 60/727; Y02E 60/7853; Y02E 60/76; Y02E 60/7861; Y04S 10/26; Y04S 40/126; Y04S 10/525; Y04S 40/127; Y04S 40/22
See application file for complete search history.

(56) References Cited

U.S. PATENT DOCUMENTS

| | | |
|---|---|---|
| 3,771,356 A | 11/1973 | Mitchell et al. |
| 4,384,289 A | 5/1983 | Stillwell et al. |
| (Continued) | | |

FOREIGN PATENT DOCUMENTS

| | | |
|---|---|---|
| EP | 0223507 A2 | 5/1987 |
| EP | 1 385 013 A1 | 1/2004 |
| (Continued) | | |

OTHER PUBLICATIONS

Cram, Professor, "Non-Right Triangles Study Sheet," Aug. 13, 2007, College-Cram Trigonometry, pp. 1-2.*

(Continued)

*Primary Examiner* — Mischita Henson
*Assistant Examiner* — Christine Liao
(74) *Attorney, Agent, or Firm* — Merchant & Gould P.C.

(57) ABSTRACT

Monitoring may be provided. First, data may be received comprising a current location of a point on a span of conductor or a current angle of a section of the span of conductor. Next, a sag may be calculated of the span of conductor based upon the current location of the point on the span of conductor and the current angle of the section of the span of conductor. An alert may then be provided when the calculated sag is outside of a predetermined range for the span.

14 Claims, 7 Drawing Sheets

(51) Int. Cl.
*H02J 13/00* (2006.01)
*G01C 9/00* (2006.01)
*G01R 15/14* (2006.01)

(52) U.S. Cl.
CPC ............. Y02E 60/727 (2013.01); Y02E 60/74 (2013.01); Y04S 10/26 (2013.01); Y04S 10/30 (2013.01)

(56) References Cited

U.S. PATENT DOCUMENTS

| | | |
|---|---|---|
| 4,420,752 A | 12/1983 | Davis et al. |
| 4,689,752 A | 8/1987 | Fernandes et al. |
| 4,728,887 A | 3/1988 | Davis |
| 4,777,381 A | 10/1988 | Fernandes |
| 4,786,862 A | 11/1988 | Sieron |
| 4,794,327 A | 12/1988 | Fernandes |
| 4,796,027 A | 1/1989 | Smith-Vaniz |
| 4,806,855 A | 2/1989 | Davis |
| 4,808,917 A | 2/1989 | Fernandes et al. |
| 4,821,138 A | 4/1989 | Nakano et al. |
| 4,827,272 A | 5/1989 | Davis |
| 4,829,298 A | 5/1989 | Fernandes |
| 4,886,980 A | 12/1989 | Fernandes et al. |
| 4,891,576 A | 1/1990 | Jacobs et al. |
| 4,894,785 A | 1/1990 | Fernandes |
| 4,904,996 A | 2/1990 | Fernandes |
| 5,006,846 A | 4/1991 | Granville et al. |
| 5,029,101 A | 7/1991 | Fernandes |
| 5,107,447 A | 4/1992 | Ozawa et al. |
| 5,121,644 A | 6/1992 | Grey et al. |
| 5,140,257 A | 8/1992 | Davis |
| 5,214,595 A | 5/1993 | Ozawa et al. |
| 5,235,681 A | 8/1993 | Masuzaki et al. |
| 5,235,861 A | 8/1993 | Seppa |
| 5,341,088 A | 8/1994 | Davis |
| 5,397,983 A | 3/1995 | Zabar et al. |
| 5,517,864 A | 5/1996 | Seppa |
| 5,559,430 A | 9/1996 | Seppa |
| 5,565,783 A | 10/1996 | Lau et al. |
| 5,821,463 A | 10/1998 | Ngo |
| 5,859,596 A | 1/1999 | McRae |
| 5,892,430 A | 4/1999 | Wiesman et al. |
| 5,918,288 A | 6/1999 | Seppa |
| 5,933,355 A | 8/1999 | Deb |
| 6,097,298 A * | 8/2000 | Brown .................... 340/657 |
| 6,205,867 B1 | 3/2001 | Hayes et al. |
| 6,229,451 B1 | 5/2001 | Brown |
| 6,523,424 B1 * | 2/2003 | Hayes et al. ............. 73/862.391 |
| 6,633,169 B1 | 10/2003 | Cavigelli |
| 6,677,743 B1 | 1/2004 | Coolidge et al. |
| 6,727,604 B2 | 4/2004 | Couture |
| 6,735,549 B2 | 5/2004 | Ridolfo |
| 6,776,572 B2 | 8/2004 | Reist |
| 6,799,080 B1 | 9/2004 | Hylden et al. |
| 6,873,746 B2 | 3/2005 | Stewart et al. |
| 7,066,524 B2 | 6/2006 | Schmeichel et al. |
| 7,103,511 B2 | 9/2006 | Petite |
| 7,136,725 B1 | 11/2006 | Paciorek et al. |
| 7,188,997 B2 | 3/2007 | Tillman et al. |
| 7,274,186 B2 | 9/2007 | Yakymyshyn et al. |
| 7,279,884 B2 | 10/2007 | Yakymyshyn et al. |
| 7,279,885 B2 | 10/2007 | Yakymyshyn et al. |
| 7,282,944 B2 | 10/2007 | Gunn et al. |
| 7,310,948 B2 | 12/2007 | Shirmohamadi |
| 7,336,202 B2 | 2/2008 | Kawai et al. |
| 7,369,045 B2 | 5/2008 | Hansen |
| 7,430,932 B2 | 10/2008 | Mekhanoshin et al. |
| 7,494,271 B2 | 2/2009 | Scholtz et al. |
| 7,504,819 B2 | 3/2009 | Engelhardt |
| 7,575,371 B1 | 8/2009 | Yakymyshyn et al. |
| 7,620,517 B2 | 11/2009 | Scholtz et al. |
| 7,641,387 B2 | 1/2010 | Engelhardt et al. |
| 7,672,794 B2 | 3/2010 | Gysling et al. |
| 7,705,747 B2 | 4/2010 | Twitchell, Jr. |
| 7,733,094 B2 | 6/2010 | Bright et al. |
| 7,786,894 B2 | 8/2010 | Polk et al. |
| 7,845,847 B2 | 12/2010 | Yakymyshyn et al. |
| 7,845,848 B2 | 12/2010 | Yakymyshyn et al. |
| 7,902,854 B2 | 3/2011 | Gunn et al. |
| 7,930,141 B2 | 4/2011 | Banting |
| 7,987,071 B1 | 7/2011 | Dorfman et al. |
| 8,386,198 B2 | 2/2013 | Lancaster |
| 8,744,790 B2 | 6/2014 | Lancaster |
| 2003/0014199 A1 | 1/2003 | Toomey |
| 2005/0058081 A1* | 3/2005 | Elliott .................. G01S 13/825 370/252 |
| 2006/0265175 A1 | 11/2006 | Shimohamadi |
| 2007/0038396 A1 | 2/2007 | Zima et al. |
| 2008/0077336 A1 | 3/2008 | Fernandes |
| 2008/0156524 A1* | 7/2008 | Jachim .................... H02G 1/04 174/40 R |
| 2008/0189061 A1 | 8/2008 | Scholtz et al. |
| 2009/0015239 A1 | 1/2009 | Georgiou et al. |
| 2009/0115426 A1 | 5/2009 | Muench, Jr. et al. |
| 2009/0243876 A1 | 10/2009 | Lilien et al. |
| 2009/0284249 A1 | 11/2009 | Syracuse et al. |
| 2010/0017153 A1 | 1/2010 | Strehl |
| 2010/0033345 A1 | 2/2010 | Polk et al. |
| 2010/0085036 A1 | 4/2010 | Banting et al. |
| 2010/0114392 A1 | 5/2010 | Lancaster |
| 2011/0080283 A1 | 4/2011 | Schweitzer, III et al. |
| 2011/0196535 A1 | 8/2011 | Phillips et al. |
| 2011/0196536 A1 | 8/2011 | Phillips et al. |
| 2011/0218790 A1 | 9/2011 | Algaonkar et al. |
| 2011/0238374 A1 | 9/2011 | Lancaster |
| 2012/0197558 A1 | 8/2012 | Henig et al. |
| 2012/0299603 A1 | 11/2012 | Zhao |
| 2013/0022078 A1 | 1/2013 | Phillips et al. |
| 2013/0054162 A1 | 2/2013 | Smith et al. |

FOREIGN PATENT DOCUMENTS

| | | |
|---|---|---|
| EP | 1 703 428 A2 | 9/2006 |
| EP | 2 369 718 A2 | 9/2011 |
| WO | WO 95/29553 | 11/1995 |
| WO | WO 95/35478 | 12/1995 |
| WO | WO 98/20468 | 5/1998 |
| WO | WO 2000/062317 A1 | 10/2000 |
| WO | WO 02/37925 A2 | 5/2002 |
| WO | 2002093279 A2 | 11/2002 |
| WO | WO 2004/038891 A2 | 5/2004 |
| WO | WO 2005/059491 A2 | 6/2005 |
| WO | WO 2006/085804 A1 | 8/2006 |
| WO | WO 2007/031435 A1 | 3/2007 |
| WO | WO 2007/134022 A2 | 11/2007 |
| WO | WO 2007/149668 A2 | 12/2007 |
| WO | WO 2008/097458 A1 | 8/2008 |
| WO | WO 2009/058955 A1 | 5/2009 |
| WO | WO 2010/042442 A1 | 4/2010 |
| WO | WO 2010/054072 A1 | 5/2010 |
| WO | WO 2010/127145 A1 | 11/2010 |
| WO | WO 2011/042906 A1 | 4/2011 |
| WO | WO 2011/100404 A1 | 8/2011 |
| WO | WO 2011/100409 A1 | 8/2011 |
| WO | WO 2011/119065 A2 | 9/2011 |
| WO | WO 2012/162486 A2 | 11/2012 |

OTHER PUBLICATIONS

Copending U.S. Appl. No. 13/776,956, filed Feb. 26, 2013 entitled "Real-Time Power Line Rating".
U.S. Final Office Action dated Mar. 27, 2014 cited in U.S. Appl. No. 12/729,319, 38 pgs.
Mexican Office Action dated Feb. 15, 2013 cited in Application No. MX/a/2011/004874, 4 pgs.
U.S. Office Action dated Aug. 29, 2014 cited in U.S. Appl. No. 12/729,319, 21 pgs.
Mexican Office Action dated Feb. 11, 2014 cited in Application No. MX/a/2011/003141, 10 pgs.
U.S. Office Action dated May 13, 2013 cited in U.S. Appl. No. 13/776,956, 19 pgs.

(56) References Cited

OTHER PUBLICATIONS

U.S. Department of Energy, "Sensing and Measurement," (2007), 26 pgs.
Whapham et al., "Use of factor-formed dead-ends on high temperature conductors," Transmission and distribution conference and exhibition IEEE PES (2006), 5 pgs.
Fierro-Chavez et al, "Online leakage current monitoring of 400 kV insulator strings in polluted areas," IEEE (1996), 5 pgs.
Wang et al., Oak Ridge National Laboratory, ORNL/TM-2008/156, "Integrity of ACSR Full tension single0stage splice connector at higher operation temperature," (2008), 191 pgs.
RUS-Bulleting 1724E-200, "Design manual for high voltage transmission lines," (2009), 322 pgs.
A. Akbar et al., "Insulator Pollution Monitoring," Electra No. 152, Feb. 1994, pp. 78-89.
J. Lundquist et al., "New Method for Measurement of the Resistive Leakage Currents of Metal-Oxide Surge Arresters in Service," IEEE 1989, pp. 1-9.
A. Vlastós et al., "Outdoor Leakage Current Monitoring of Silicone Composite Insulators in Coastal Service Conditions," IEEE Transactions on Power Delivery, vol. 11, No. 2, Apr. 1996, pp. 1066-1070.
Doble brochure, IDD, Intelligent Diagnostic Device, Jun. 2013, 2 pgs.
Mike Mahoney, Nerac citation, Nerac, Inc., Electrical Cables; Power Delivery; Power Distribution Patents, Mar. 23, 2013, pp. 1-15.
Mexican Office Action dated Jun. 12, 2013 cited in Application No. MX/a/2011/003141, 5 pgs.
U.S. Office Action dated Jul. 30, 2013 cited in U.S. Appl. No. 12/729,319, 39 pgs.
International Search Report dated Oct. 11, 2013 cited in Application No. PCT/us2013/049908.
Mexican Office Action dated Sep. 24, 2012 cited in Application No. MX/a/2011/004874, 6 pgs.
Transmission & Distribution World, "Oncor Seeks Stimulus Funds for Real-Time Dynamic Transmission Line Rating Technology Study," Aug. 27, 2009, Business Wire, 2 pgs., http://www:tdworld.com/test_monitor_control/highlights/oncor-transmission-line-rating-funds-0809/index.html.
RUS Bulletin 1724E-200, Design Manual for High Voltage Transmission Lines, Electric Staff Division, Rural Utilities Service, U.S. Department of Agriculture, Revised May 2005, 314 pgs.
Gary Schmidt et al., "Advances in Fiber Optic Distributed Temperature Sensing for Underground Transmission Cables," presented to the Cable Systems Sub-Committee C of the IEEE PES Insulated Conductors Committee, St. Petersburg, FL, Nov. 1999, 6 pgs.
International Search Report dated Mar. 9, 2010 cited in Application No. PCT/US2009/063390.
G.P. Van Der Wijk et al., "An Intelligent HV Power Cable System," CIGRE 1996: 15/21/33-11, 6 pgs., publication unknown.
Cable Design—partial article, pp. 2-10, author, publication, & date unknown.
O. Nigol et al., "Characteristics of ACSR Conductors at High Temperatures and Stresses," IEEE Transactions on Power Apparatus and Systems, vol. PAS-100, No. 2, Feb. 1981, pp. 485-493.
"ComEd: Energized for the Future," Commonwealth Edison pamphlet, 10 pgs., date unknown.
Gene Sanders, "Fo Conductor: Temp Sensing," Problem Solving Report Question No. 1058607.002, Jan. 19, 2000, pp. 1-18.
K.T. Yoon, "Controlling and Monitoring Singapore's Underground Grid," PowerGrid Ltd., Singapore, ISSN 0895-0156, Oct. 1999, pp. 23-29.

Todd Hudson, "Fine-tuned for cable TV Introducing an optical power meter ideally suited for analog measurements," Communications Test Equipment, Siemens Industrial Automation, Products, 1 pg., date unknown.
"Guide for Partial-Discharge Test Procedure," Publication T-24-380, Revised Dec. 1980, Insulated Cable Engineers Association, Inc., 6 pgs., author unknown.
Jay A. Williams et al., "Increasing Cable Rating by Distributed Fiber Optic Temperature Monitoring and Ampacity Analysis," Transmission and Distribution Conference, IEEE vol. 1, Apr. 1999, 7 pgs.
D.A. Douglass, "Radial and Axial Temperature Gradients in Bare Stranded Conductor," IEEE Power Engineering Review, Apr. 1986, PER 6/Issue 4, pp. 1-7.
J.F. Minambres et al., "Radial Temperature Distribution in ACSR Conductors Applying Finite Elements," Power Delivery, IEEE Transactions on vol. 14, Issue 2, Apr. 1999, pp. 473-480.
Stephen D. Foss et al., "Significance of the Conductor Radial Temperature Gradient within a Dynamic Line Rating Methodology," IEEE Power Delivery, vol. 2, Issue 2, 1986, 7 pgs.
Tom Rodenbaugh et al., "Temperature sensors maximize underground cable power transfer," Electric Light & Power, Dec. 1, 1998, Technology, 2 pgs.
Ichiro Matsubara et al., "Total Monitoring System for the Reihoku Thermal Power Transmission Line of the Kyushu Electric Power Company," 7 pgs, publication & date unknown.
AEIC CS5-94, Specifications for Cross-Linked Polyethylene Insulated Shielded Power Cables Rated 5 Through 46 Kv, $10^{th}$ Edition, Association of Edison Illuminating Companies, Mar. 1, 1994, author unknown, pp. 24, 25, 33, & 34.
Alfred Roller et al., "Fortified with Fiber Optics," Siemens Telecommunication Cables, Neustadt, Technology, 3 pgs., date unknown.
Murray W. Davis, "A New Thermal Rating Approach: The Real Time Thermal Rating System for Strategic Overhead Conductor Transmission Lines, Part I, General Description and Justification of the Real Time Thermal Rating System," IEEE Transactions on Power Apparatus and Systems, vol. PAS-96, No. 3, May/Jun. 1977, pp. 803-809.
G.R. Kirikera et al., "Initial evaluation of an active/passive structural neural system for health monitoring of composite materials," Institute of Physics, Smart Materials & Structures, 2006, pp. 1275-1286.
U.S. Office Action dated Jul. 6, 2011 cited in U.S. Appl. No. 12/729,319, 19 pgs.
U.S. Final Office Action dated May 14, 2012 cited in U.S. Appl. No. 12/729,319, 27 pgs.
U.S. Office Action dated Jun. 13, 2012 cited in U.S. Appl. No. 12/612,728, 21 pgs.
U.S. Office Action dated May 22, 2015 cited in U.S. Appl. No. 12/729,319, 18 pgs.
U.S. Final Office Action dated Jul. 1, 2016 cited in U.S. Appl. No. 12/729,319, 23 pgs.
U.S. Office Action dated Nov. 5, 2015 cited in U.S. Appl. No. 12/729,319, 20 pgs.
Canadian Office Action dated Mar. 30, 2017 cited in Application No. 2,735,353, 8 pgs.
U.S. Office Action dated Jun. 30, 2017 cited in U.S. Appl. No. 12/729,319, 36 pgs.
EP Communication dated Mar. 24, 2017 cited in Application No. 13 741 938.8, 6 pgs.
EP Extended Search Report dated Aug. 29, 2017 cited in Application No. 11159356.2, 7 pgs.
U.S. Final Office Action dated Jan. 11, 2018 cited in U.S. Appl. No. 12/729,319, 26 pgs.

* cited by examiner

POWER LINE MAINTENANCE MONITORING

RELATED APPLICATIONS

This application is a Continuation-in-Part of co-pending U.S. application Ser. No. 12/729,319 entitled "Power Line Maintenance Monitoring" filed Mar. 23, 2010, which is incorporated herein by reference.

This patent application is also related to U.S. patent application Ser. No. 12/612,728, entitled "Real-Time Power Line Rating" filed Nov. 5, 2009, which claims the benefit under provisions of 35 U.S.C. § 119(e) to U.S. Provisional Application No. 61/111,814 filed Nov. 6, 2008, which are incorporated herein by reference in its entirety.

COPYRIGHTS

All rights, including copyrights, in the material included herein are vested in and the property of the Applicants. The Applicants retain and reserve all rights in the material included herein, and grant permission to reproduce the material only in connection with reproduction of the granted patent and for no other purpose.

BACKGROUND

A power line is a system of many components. These components include conductors, splices, dead-ends, insulators, and structures. Power line monitoring and inspection has conventionally been done manually on a scheduled basis. This requires a utility company crew with equipment to visit each structure on the power line to visually inspect the components. Additionally, some utility companies use a helicopter to "fly" the power line and perform a visual and thermal inspection. Generally a utility company will determine an inspection schedule, attempting to balance cost of the inspection verses cost of repairing the failure and service interruption. With conventional power line monitoring and inspection, however, potential component failure points may go undetected, especially if the inspections occur when the power line is lightly loaded. Accordingly, conventional power line monitoring and inspection is time consuming, expensive, prone to inaccuracy, and components can fail between extended inspection cycles.

SUMMARY

This Summary is provided to introduce a selection of concepts in a simplified form that are further described below in the Detailed Description. This Summary is not intended to identify key features or essential features of the claimed subject matter. Nor is this Summary intended to be used to limit the claimed subject matter's scope.

Monitoring may be provided. First, data may be received comprising a current location of a point on a span of conductor or a current angle of a section of the span of conductor. Next, a sag may be calculated of the span of conductor based upon the current location of the point on the span of conductor and the current angle of the section of the span of conductor. An alert may then be provided when the calculated sag is outside of a predetermined range for the span.

Both the foregoing general description and the following detailed description provide examples and are explanatory only. Accordingly, the foregoing general description and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

Figure 1:
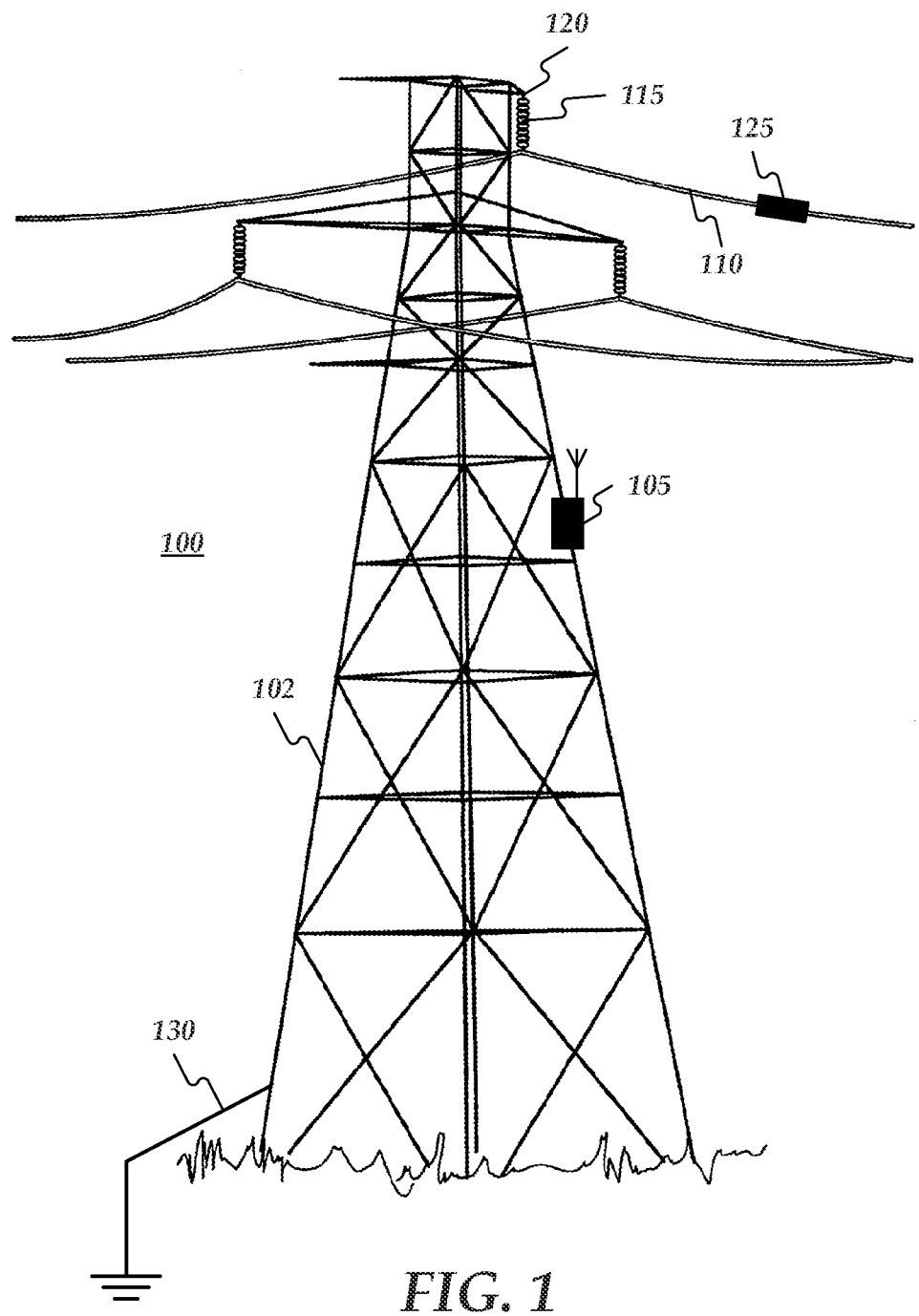
FIG. 1 shows an operating environment.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention.

Electric power lines are systems of many components. These components comprise, but are not limited to, conductors, conductor splices, conductor dead-ends, insulators, strings of insulators (i.e., insulator strings,) insulator string supports, structures, and structure grounds. Utility companies may manually inspect these components on a scheduled basis. These manual inspections are time consuming, expensive, prone to inaccuracy, and components may fail between extended manual inspection cycles.

Consistent with embodiments of the invention, a real-time power line maintenance monitoring system may provide a utility company with information on the status of a power line, the interpretation of this information, and display of this information in a manner that may allow the utility company to optimize the operation and maintenance of the power line. This may allow for increased power line reliability as the utility company may be able to determine if the power line is approaching its clearance limit or if a monitored component is failing. Embodiments of the invention may allow "continuous" monitoring of power line components. This continuous monitoring may reduce inspection expenses over conventional manual processes and provide earlier indication of potential component failure.

FIG. 1 shows an operating environment 100 used to transmit or deliver electrical power. As shown in FIG. 1, operating environment 100 may include a structure 102, a power line monitor 105, a conductor 110, an insulator string 115, an insulator string support 120, a conductor splice 125, and a structure ground 130. Structure 102 may support conductor 110. While structure 102 is shown in FIG. 1 as a galvanized steel lattice tower, structure 102 may comprise any structure configured to support conductor 110 such as a steel pole structure, a wooden pole structure, or a structure made of any material configured in any way.

Conductor 110 may comprise any type conductor used to transmit electric power such as, but not limited to, Aluminum Conductor Steel Reinforced (ACSR). Conductor splice 125 may comprise any component configured to splice conductor 110. Insulator string 115 may comprise any component configured to insulate conductor 110 from structure 102. Insulator string support 120 many comprise any component configured to attach insulator string 115 to structure 102. Structure ground 130 may comprise any component that grounds structure 102 to the Earth, for example, a grounding rod(s) and a connector.

Figure 2:
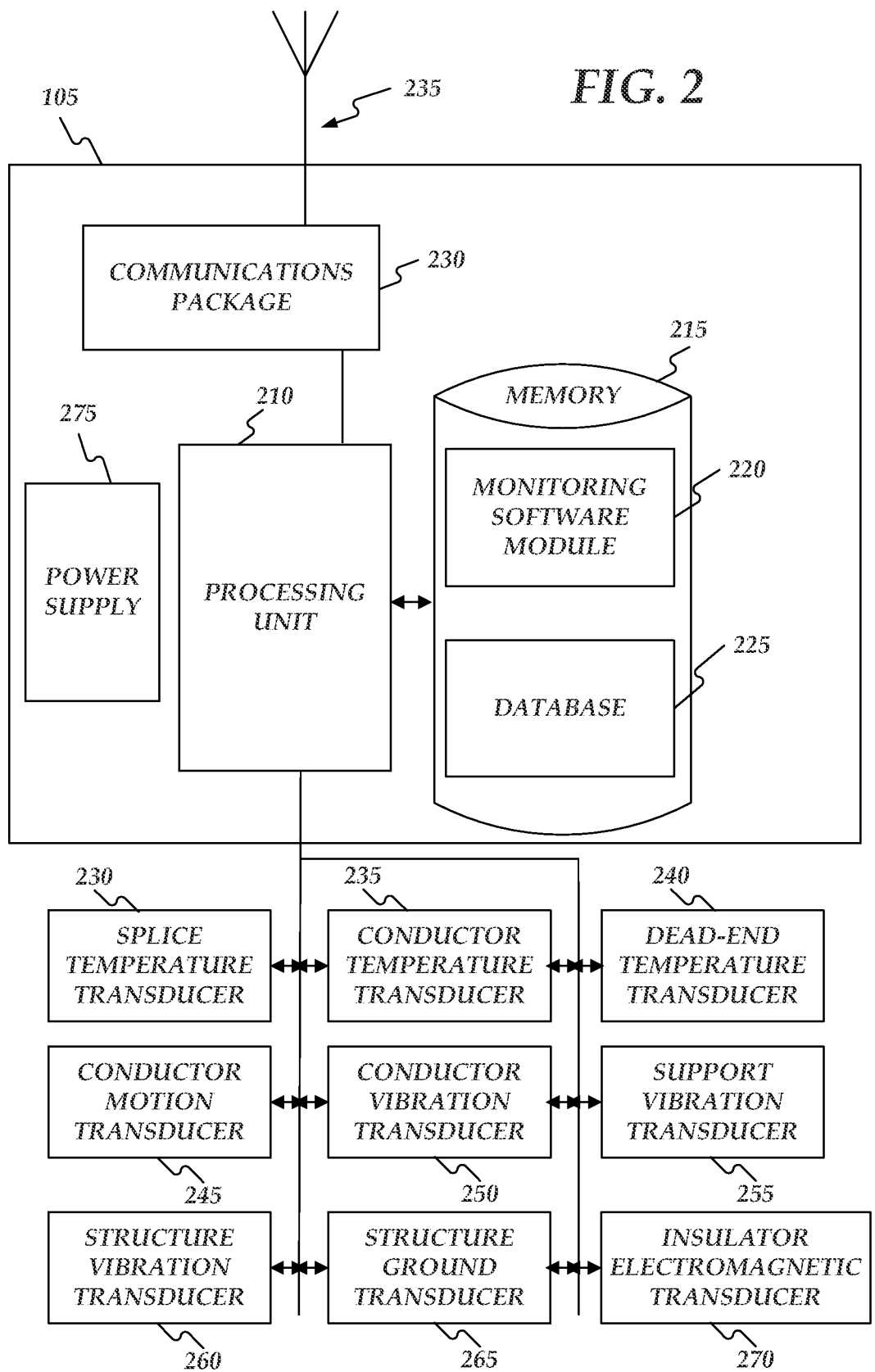
FIG. 2 shows a power line monitor.

FIG. 2 shows power line monitor 105 in more detail. As shown in FIG. 2, power line monitor 105 may include a processing unit 210 and a memory 215. Memory 215 may include a monitoring software module 220 and a database 225. While executing on processing unit 210, monitoring software module 220 may perform processes for providing maintenance monitoring including, but not limited to, one or more of the stages of a method 500 as described below in greater detail with respect to FIG. 5.

Power line monitor 105 may also include a communications package 230 that may include and antenna 235 and may be connected to processing unit 210. Communications package 230 may transmit status data collected from power line monitor 105 and may receive other data including control data. Communications package 230 may communicate over a network (not shown). The network may comprise, for example, a local area network (LAN) or a wide area network (WAN). When a LAN is used as the network, a network interface located at power line monitor 105 may be used to interconnect any other processor on the network. When the network is implemented in a WAN networking environment, such as the Internet, power line monitor 105 may include an internal or external modem (not shown) or other means for establishing communications over the WAN. Further, in utilizing the network, data sent over the network may be encrypted to insure data security by using encryption/decryption techniques.

In addition to utilizing a wire line communications system, a wireless communications system, or a combination of wire line and wireless may be utilized as the network. Wireless may be defined as radio transmission via the airwaves. However, it may be appreciated that various other communication techniques can be used to provide wireless transmission, including infrared line of sight, cellular, microwave, satellite, packet radio, and spread spectrum radio. For example, power line monitor 105 may communicate across a wireless interface such as, for example, a cellular interface (e.g., general packet radio system (GPRS), enhanced data rates for global evolution (EDGE), global system for mobile communications (GSM)), a wireless local area network interface (e.g., WLAN, IEEE 802), a bluetooth interface, WiFi, WiMax, another RF communication interface, and/or an optical interface. Furthermore, power line monitor 105 may communicate over a power line carrier system.

Power line monitor 105 may communicate with a plurality of status transducers. The status transducers may include, but are not limited to, a splice temperature transducer 230, a conductor temperature transducer 235, a dead-end temperature transducer 240, a conductor motion transducer 245, a conductor vibration transducer 250, a support vibration transducer 255, a structure vibration transducer 260, a structure ground transducer 265, and an insulator breakdown transducer 270, an ambient air temperature transducer (not shown), all of which may collect and communicate status data to processing unit 210. The status transducers may communicate with processing unit 210 in any way. For example, the status transducers may communicate with processing unit 210 either over a wire or wirelessly, directly or through the network, for example. Furthermore, the status transducers and power line monitor 105 may be read wirelessly by a fixed wing aircraft or helicopter.

The plurality of status transducers may be programmed with limits such that they can make a determination when measured data exceeds those limits and transmit a warning. Embodiments of the invention may download and change these limits remotely through the network. Embodiments of the invention may also include a base/weather station (not shown). The base/weather station may receive raw data from sensors (e.g., status transducers.) Then a processor in the base/weather station may be programmed to make a determination that there is an alert condition and transmit an alert in response.

All elements within power line monitor 105 may be supplied with power from a power supply 275. Because power line monitor 105 may be in close proximity to a power line (e.g., coupled to the power line,) power supply 275 may scavenge power from the power line using a current transformer (CT,) for example. Power supply 275 may also be a solar power supply.

Figure 3:
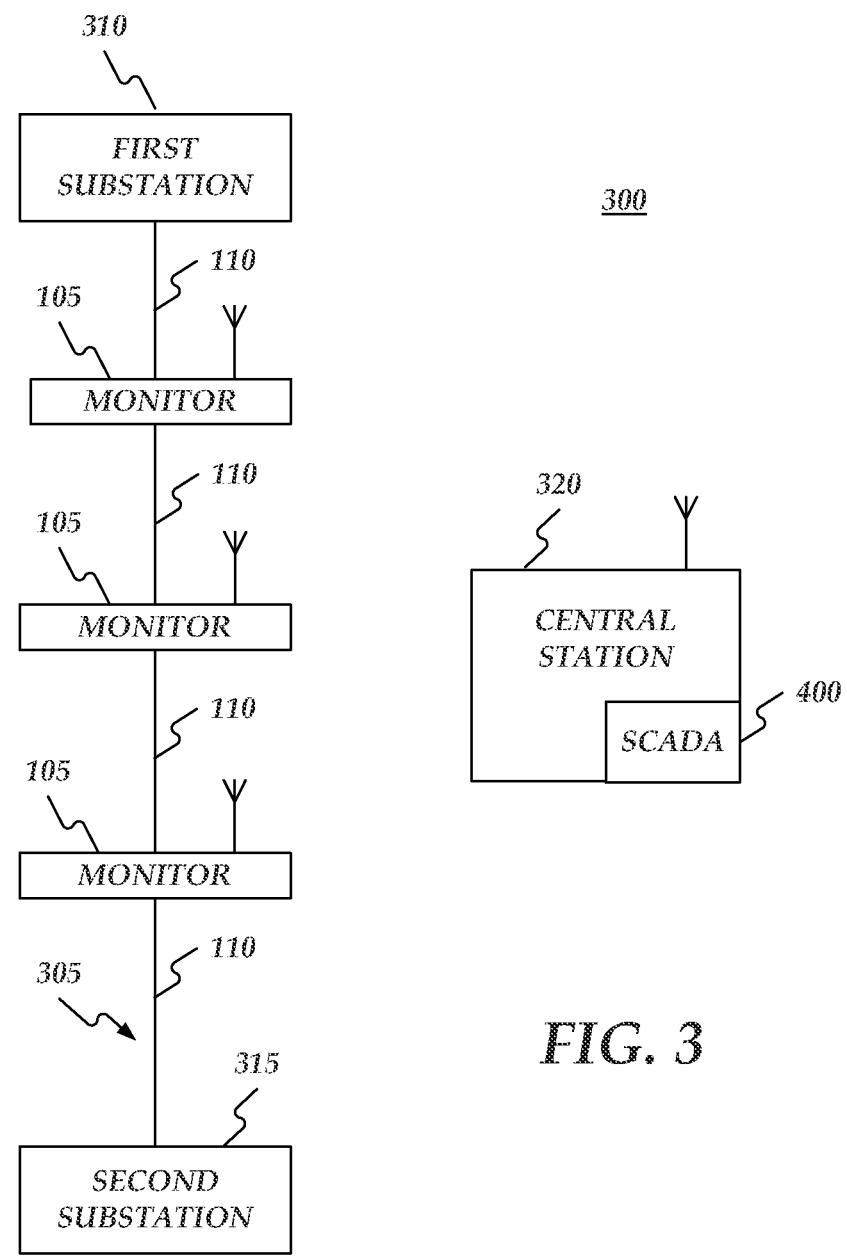
FIG. 3 shows an operating environment for the power line monitor.

FIG. 3 shows an operating environment 300 for power line monitor 105 consistent with embodiments of the invention. As shown in FIG. 3, a power line 305 (e.g., including conductor 110) may connect a first substation 310 and a second substation 315. Power line 305 may be tens or even hundreds of miles long. RUS BULLETIN 1724E-200, "DESIGN MANUAL FOR HIGH VOLTAGE TRANSMISSION LINES", published by the Electric Staff Division, Rural Utilities Service, U.S. Department of Agriculture shows how power lines may be designed.

Any number of sensor devices 105 may be placed on power line 305. Sensor devices 105 in environment 300 may include any one or more of a combination of the status transducers shown in FIG. 2. Each of the sensor devices 105 may collect status data at a location (e.g., structure) where the sensor device is located on power line 305. After collection, each of the sensor devices 105 may transmit its collected status data to a central station 320. At central station 320, the received status data may be fed into a supervisory control and data acquisition (SCADA) system 400 as shown in more detail in FIG. 4.

Figure 4:
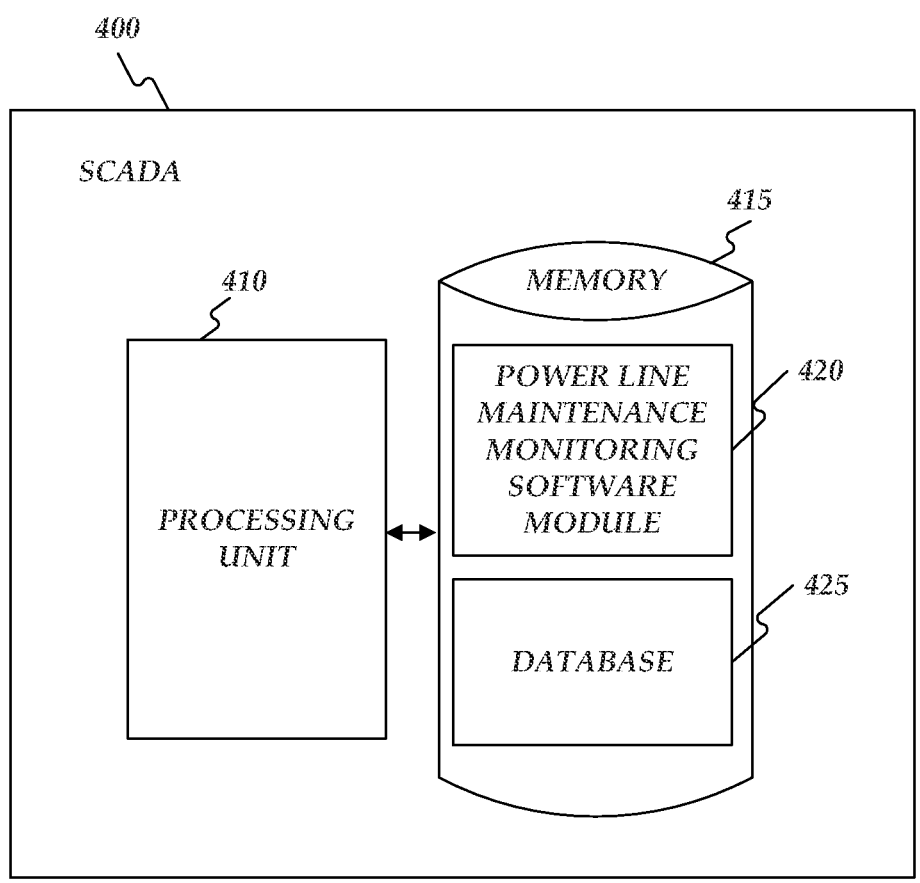
FIG. 4 shows a SCADA system.

FIG. 4 shows SCADA system 400 in more detail. As shown in FIG. 4, SCADA system 400 may include a processing unit 410 and a memory 415. Memory 415 may include a power line maintenance monitoring software module 420 and a database 425. While executing on processing unit 410, power line maintenance monitoring software module 420 may perform, for example, processes for providing maintenance monitoring including, for example, any one or more of the stages of method 500 as described in greater detail below with respect to FIG. 5.

Figure 5:
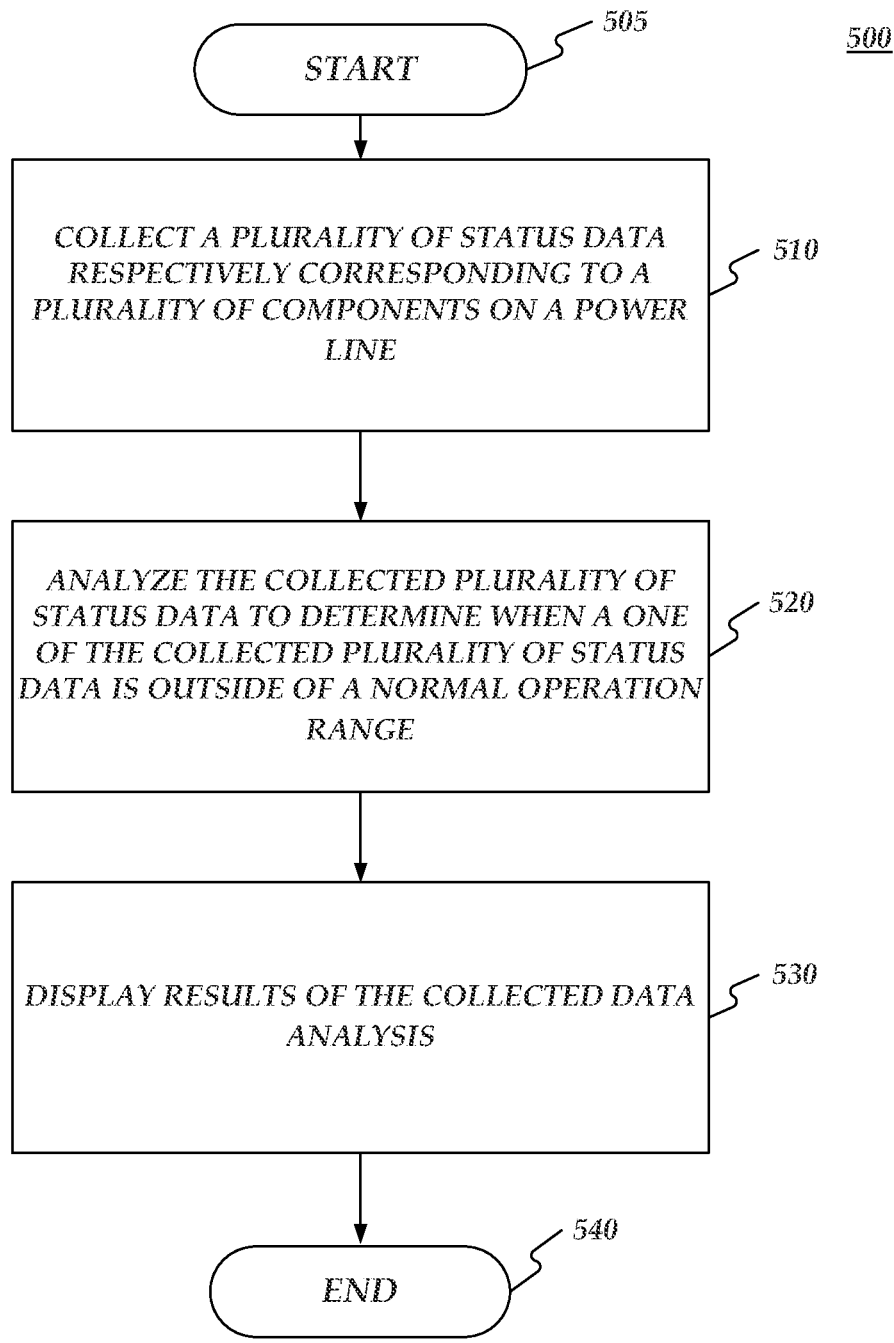
FIG. 5 is a flow chart of a method for providing maintenance monitoring.

FIG. 5 is a flow chart setting forth the general stages involved in a method 500 consistent with embodiments of the invention for providing maintenance monitoring. Method 500 may be implemented using power line monitor 105, SCADA system 400, or a combination of both power line monitor 105 and SCADA system 400. Ways to implement the stages of method 500 will be described in greater detail below.

Method 500 may begin at starting block 505 and proceed to stage 510 where power line monitor 105 may collect a plurality of status data respectively corresponding to a plurality of components on a power line. For example, the plurality of components may comprise, but are not limited to, a conductor dead-end, structure 102, conductor 110, insulator string 115, insulator string support 120, conductor splice 125, and structure ground 130.

Conductor temperature transducer 235 may be placed at or near conductor 110, may be configured to measure the temperature of conductor 110, and send the measured conductor temperature reading back to power line monitor 105. Splice temperature transducer 230 may be placed at or near conductor splice 125, be configured to measure the temperature of conductor splice 125, and send the measured splice temperature reading back to power line monitor 105. Dead-end temperature transducer 240 may be placed at or near a conductor dead-end (not shown), be configured to measure the temperature of the conductor dead-end, and send the measured dead-end temperature reading back to power line monitor 105.

Conductor motion transducer 245 may comprise, for example, an accelerometer and may be placed on conductor 110, for example, at or near mid-span. Conductor motion transducer 245 may be configured to measure the motion (e.g., movement profile) of conductor 110 and send the measured motion measurements back to power line monitor 105. The motion measurements may be used to determine if conductor 110 is in a "galloping" state. Conductor galloping is described in RUS BULLETIN 1724E-200, "DESIGN MANUAL FOR HIGH VOLTAGE TRANSMISSION LINES", published by the Electric Staff Division, Rural Utilities Service, U.S. Department of Agriculture and is incorporated herein by reference.

Conductor vibration transducer 250 may be placed on conductor 110. Conductor vibration transducer 250 may be configured to measure the vibration of conductor 110 and send the vibration measurements (e.g., vibration profile) back to power line monitor 105. The vibration measurements may be used to determine if conductor 110 is experiencing excessive Aeolian vibration (e.g., torsional conductor movement and string vibration) which can lead to conductor fatigue failures. Aeolian vibration is described in RUS BULLETIN 1724E-200, "DESIGN MANUAL FOR HIGH VOLTAGE TRANSMISSION LINES", published by the Electric Staff Division, Rural Utilities Service, U.S. Department of Agriculture and is incorporated herein by reference.

Support vibration transducer 255 may be placed at or near insulator string support 120, be configured to measure vibration of insulator string support 120, and send the measured vibration reading (e.g., vibration profile) of insulator string support 120 back to power line monitor 105. Moreover, support vibration transducer 255 may be configured to "ping" insulator string support 120 with a mechanical energy wave and measure the reflection of the mechanical energy wave in insulator string support 120 as the measured vibration reading.

Structure vibration transducer 260 may be placed on or near structure 102, be configured to measure vibration of structure 102, and send the measured vibration reading (e.g., vibration profile) back to power line monitor 105. Moreover, structure vibration transducer 260 may be configured to "ping" structure 102 with a mechanical energy wave and measure the reflection of the mechanical energy wave in structure 102 as the measured vibration reading.

Structure ground transducer 265 may be configured to "megger" structure ground 130. For example, structure ground transducer 265 may be configured measure a ground impedance of structure ground 130 at structure 102. Structure ground transducer 265 may send the measured ground impedance reading back to power line monitor 105. Insulator electromagnetic transducer 270 may be placed on or near insulator string 115, be configured to measure an electromagnetic profile of insulator string 115, and send the measured electromagnetic profile back to power line monitor 105.

Figure 6:
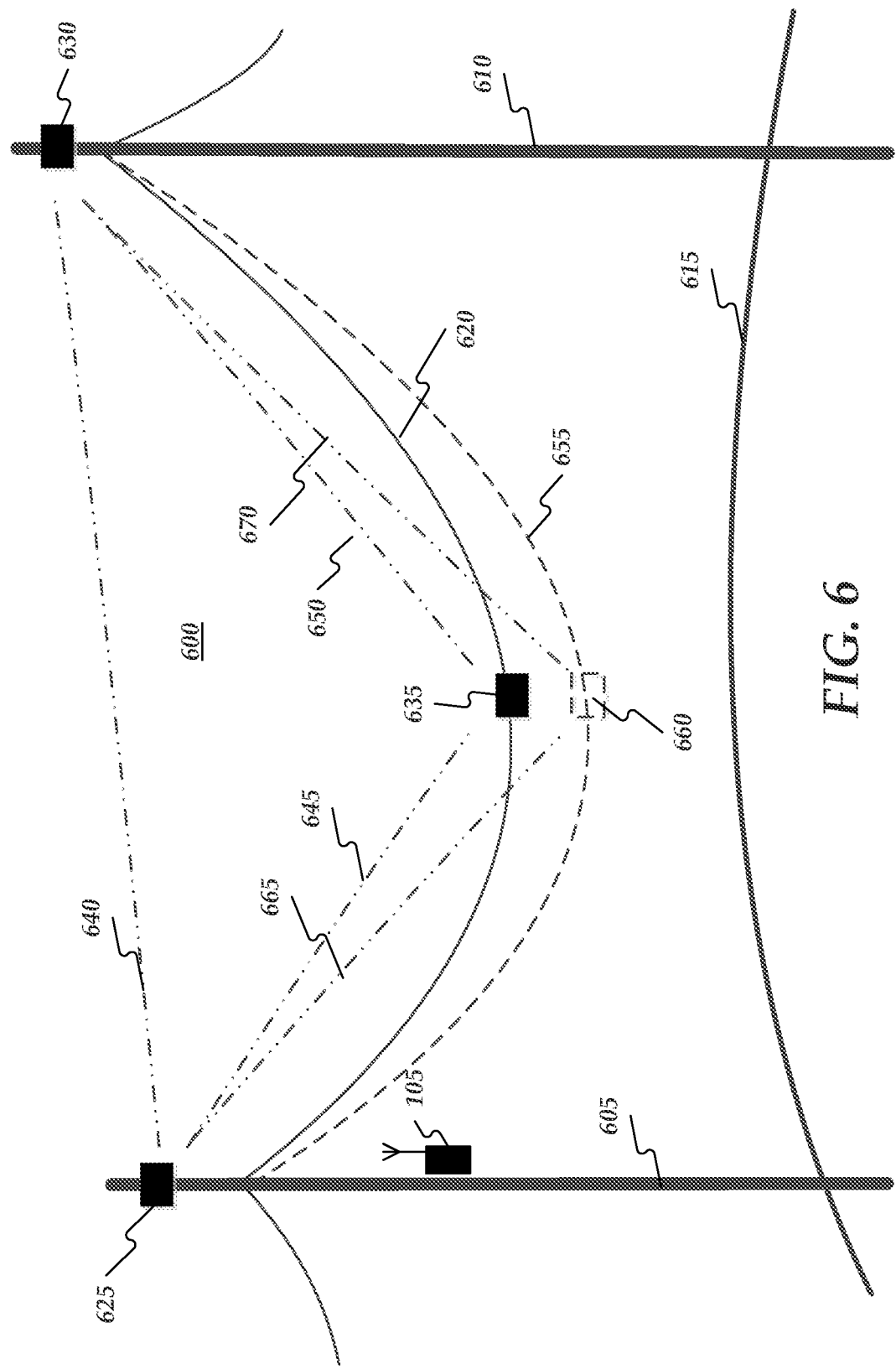
FIG. 6 shows an operating environment.

FIG. 6 shows an operating environment 600. As shown in FIG. 6, operating environment 600 may include a first structure 605, a second structure 610, a ground 615, and a span of conductor in a first position 620 above ground 615. Operating environment 600 may include a plurality of sag transceivers comprising, for example, a first sag transceiver 625, a second sag transceiver 630, and a third sag transceiver 635. The plurality of sag transceivers may be included in the plurality of status transducers of FIG. 2. First sag transceiver 625 may be disposed on first structure 605 and second sag transceiver 630 may be disposed on second structure 610. Third sag transceiver 635 may be disposed on the span of conductor, for example, substantially in the middle or at substantially the low point of sag of the span of conductor. Power line monitor 105 may be disposed, for example, on either of first structure 605 or second structure 610.

First sag transceiver 625 and second sag transceiver 630 may be disposed a first distance 640 apart, first sag transceiver 625 and third sag transceiver 635 may be disposed a second distance 645 apart, and second sag transceiver 630 and third sag transceiver 635 may be disposed a third distance 650 apart. As the amount of sag increases or decreases in the span of conductor, the distance between the span of conductor and ground 615 changes. The amount of sag may increase or decrease in the span of conductor for any number of reasons including, for example, a change in ambient temperature, a changes in the temperature of the conductor, icing in the conductor, etc.

As shown in FIG. 6, the amount of sag may increase in the span. In this case, the conductor may move from first position 620 to a second position 655. This change in the conductor's position may cause third sag transceiver 635 to move to a third sag transceiver second positions 660. Consequently, first sag transceiver 625 and third sag transceiver 635 may now be disposed a fourth distance 665 apart and second sag transceiver 630 and third sag transceiver 635 may now be disposed a fifth distance 670 apart.

In order to determine their distances apart, ones of the plurality of sag transceivers may transmit signals amongst themselves. For example, first sag transceiver 625, second sag transceiver 630, and third sag transceiver 635 may have internal synchronized clocks. First sag transceiver 625 may send a signal to third sag transceiver 635. This signal may include a time-stamp indicating the time when the signal left first sag transceiver 625. Third sag transceiver 635 may note the time that the signal was received from first sag transceiver 625. From the time stamp and the time the signal was received, third sag transceiver 635 may calculate the time it took for the signal to travel from first sag transceiver 625 to third sag transceiver 635. Third sag transceiver 635 may calculate the distance by knowing the speed of the signal and the amount of time it took the signal to get to third sag transceiver 635. This same process may be used between any of the plurality of sag transceivers to calculate first distance 640, second distance 645, third distance 650, fourth distance 665, and fifth distance 670. Furthermore this calculated distance may be communicated (e.g., over the network) amongst the plurality of sag transceivers, to power line monitor 105, and to SCADA system 400.

Once the distances between the plurality of sag transceivers is known, any of the plurality of sag transceivers, power line monitor 105, or SCADA system 400 can calculate a location of a point on the span of conductor associated with third sag transceiver 635. In calculating the location, mathematical processes including, for example, triangulation and the side-side-side theorem of geometry may be used. Embodiments of the invention may be calibrated a baseline data. The baseline data may include a distance (e.g., clearance) between ground 615 for a given location of the point on the span of conductor associated with third sag transceiver 635. Then, as this point moves per location recalculations as the sag increase or decreases, the baseline data may be used to recalculate the clearance between ground 615 and the span of conductor. If this clearance is too small as compared to a predetermined value, embodiments of the invention may provide an alert. Safety codes may be considered when setting this predetermined value.

Figure 7:
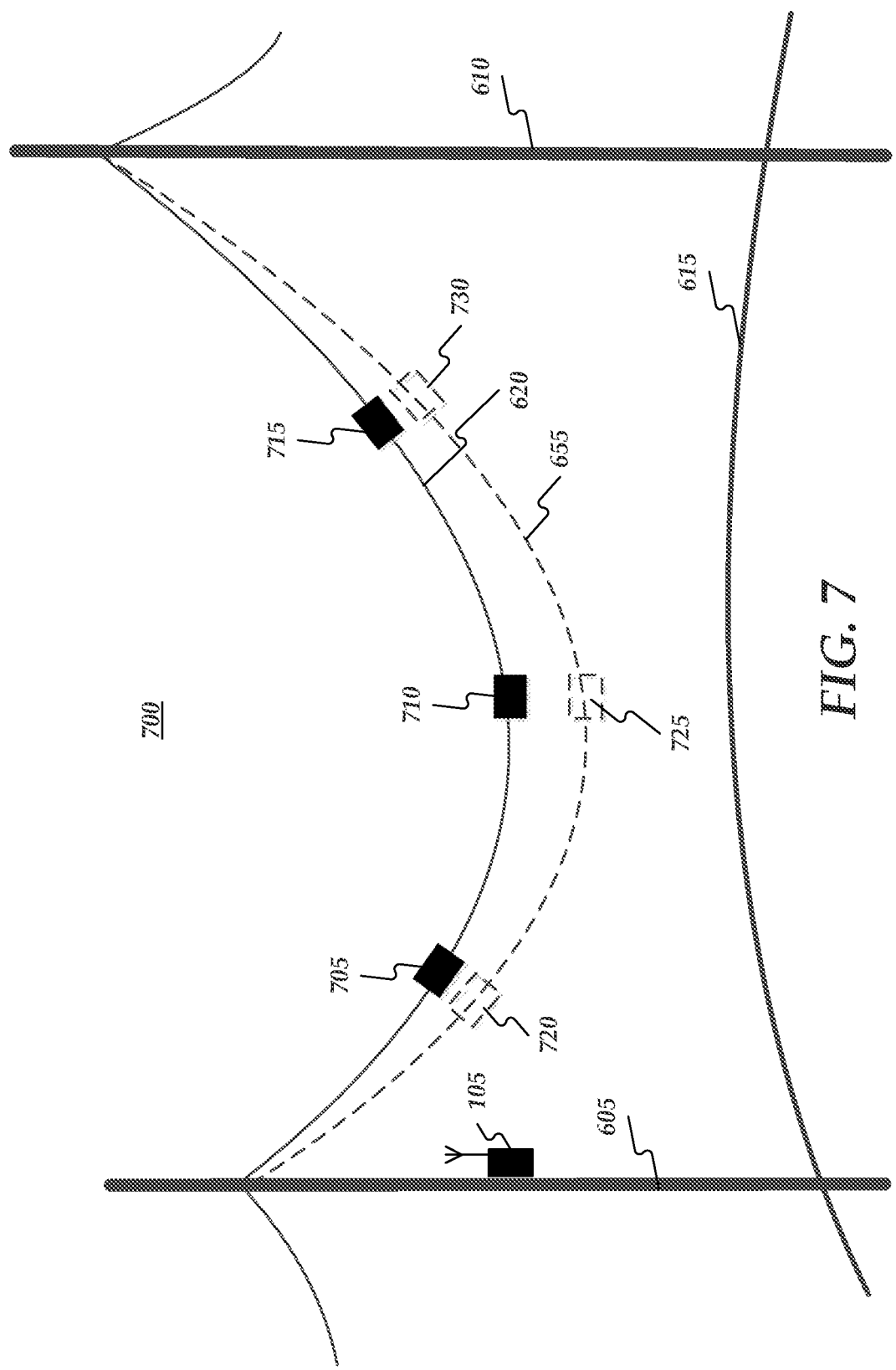
FIG. 7 shows an operating environment.

FIG. 7 shows an operating environment 700. As shown in FIG. 7, operating environment 700 may include one or more inclinometers (e.g., a first inclinometer 705, a second inclinometer 710, and a third inclinometer 715) rather than the plurality of sag transceivers of FIG. 6. The inclinometers, power line monitor 105, or SCADA system 400 may communicate data amongst each other over, for example, the network. The one or more inclinometers may be included in the plurality of status transducers of FIG. 2.

Any one of the inclinometers can provide an angle of a section of the span of conductor associated with the inclinometer. Embodiments of the invention may be calibrated with baseline data. The baseline data may include a distance (e.g., clearance) between ground 615 and a low point of sag on the span of conductor for a given angle indicated by any of the inclinometers. As the angle indicated by any of the inclinometers changes as the sag in the span of conductor increases or decreases from the baseline, the ground clearance distance between ground 615 and a low point of sag on the span of conductor may be recalculated. This recalculation may be performed, for example, by the inclinometers, power line monitor 105, or SCADA system 400. If this clearance is too small as compared to a predetermined value, embodiments of the invention may provide an alert. Safety codes may be considered when setting this predetermined value.

From stage 510, where power line monitor 105 collects the plurality of status data, method 500 may advance to stage 520 where power line monitor 105 (or SCADA 400) may analyze the collected plurality of status data to determine when a one of the collected plurality of status data is outside of a normal operation range for a one of the plurality of components corresponding to the one of the collected plurality of status data. Consistent with embodiments of the invention, the collected plurality of status data may be trended and interpreted. This may include, but is not limited to, providing: i) trending of component data; ii) heuristic algorithms specific to each monitored component type, which may interpret real-time and trended data to determine if the component is degrading; and iii) comparison of algorithm outputs to alarm set points to determine estimation of effects of conditions on remaining component life.

For example, conductor splices and conductor dead-ends may deteriorate over time and may eventually fail. As they approach their failure point, they become hotter and hotter. Consequently, the temperature of conductor splice 125 and/or the conductor deadened may be compared to the temperature of conductor 110. If the temperature of conductor splice 125 and/or the temperature of the conductor deadened is greater than the temperature of conductor 110 by a predetermined amount, then the temperature of conductor splice 125 and/or the temperature of the conductor deadened may be considered to be out side of the normal operation range for conductor splice 125 and/or the conductor deadened.

As another example, conductor 110 may be prone to "galloping." Conductor galloping (sometimes called dancing), is a phenomenon where power line conductors move with large amplitudes. Galloping usually occurs when an unsteady, high or gusty wind blows over a conductor covered by a layer of ice deposited by freezing rain, mist, or sleet. The coating may vary from a very thin glaze on one side to a solid three-inch cover giving the conductor an irregularly shaped profile. Consequently, this ice covering may give the conductor a slightly out-of-round, elliptical, or quasi-airfoil shape. Wind blowing over this irregularly shaped profile results in aerodynamic lift that causes the conductor to gallop. The wind can be anything between 5 to 45 miles-per-hour at an angle to the power line of 10 to 90 degrees. The wind may be unsteady in velocity or direction. Consequently, the movement profile of conductor 110 may be periodically analyzed by conductor motion transducer 245, power line monitor 105, or SCADA 400 to see if the motion of conductor 110 is consistent with the galloping conductor phenomenon.

As another example, conductor 110 may be prone to damage through Aeolian vibration. Aeolian vibration is a high-frequency low-amplitude oscillation generated by a low velocity, comparatively steady wind blowing across a conductor. This steady wind creates air vortices or eddies on the lee side of the conductor. These vortices or eddies will detach at regular intervals from the top and bottom area of the conductor (i.e., "vortex shedding") creating a force on the conductor that is alternately impressed from above and below. If the frequency of the forces (i.e., expected excitation frequency) approximately corresponds to a frequency of a resonant vibration mode for a conductor span (i.e., natural frequency of the power line), the conductor will tend to vibrate in many loops in a vertical plane. The frequency of resonant vibration depends mainly on conductor size and wind velocity and is generally between 5 and 100 Hz for wind speeds within the range of 0 to 15 miles per hour. The peak-to-peak vibration amplitudes will cause alternating bending stresses great enough to produce fatigue failure in the conductor strands at the attachment points to the power line structure. Tensioned conductors in long spans are particularly subject to vibration fatigue. This vibration is generally more severe in flat open terrain where steady winds are more often encountered. Consequently, the vibration profile of conductor 110 may be periodically analyzed by conductor vibration transducer 250, power line monitor 105, or SCADA 400 to see if the vibration of conductor 110 is greater than acceptable levels or significantly different than a vibration profile taken at a previous time (e.g., when the power line including structure 102 was first constructed).

Insulator string 115 may be connected to structure 102 on insulator string support 120. Insulator string support 120, however, may weaken and loosen due to vibration. Damage to insulator string support 120 may be detectable through vibration or excessive motion. Consequently, the vibration profile of insulator string support 120 may be periodically analyzed by support vibration transducer 255, power line monitor 105, or SCADA 400 to see if the vibration of insulator string support 120 is greater than acceptable levels or significantly different than a vibration profile taken at a previous time (e.g., when the power line including structure 102 was first constructed).

Power line structures (e.g., structure 102), for example, may be made of concrete, wood, or steel. Regardless of the material, power line structures may deteriorate, for example, by rot, rust, corrode, or the bolts of a lattice structure may loosen. A level of deterioration can be determined by how structure 102 vibrates. Consequently, the vibration profile of structure 102 may be periodically analyzed by structure vibration transducer 260, power line monitor 105, or SCADA 400 to see if the vibration of structure 102 is greater than acceptable levels or significantly different than a vibration profile taken at a previous time (e.g., when the power line including structure 102 was first constructed).

Structure 102 may be grounded through structure ground 130. Structure ground 130 may comprise a ground rod or a series of ground rods being driven into the earth near structure 102. The ground rod or a series of ground rods are connect to structure 102 by a wire. While an impedance of structure ground 130 may have been checked and found acceptable (e.g., between 20 ohms and 40 ohms) when structure 102 was built, the grounding of structure 102 may deteriorate over time. Consequently, the impedance of structure ground 130 may be periodically analyzed by structure ground transducer 265, power line monitor 105, or SCADA 400 to see if the impedance of structure ground 130 is greater than a predetermined acceptable level or significantly different than an impedance of structure ground 130 taken at a previous time (e.g., when the power line including structure 102 was first constructed).

With power lines, conductors may be supported or terminated (e.g., dead-end) at structures where conductors may be electrical isolation via insulator strings. Insulator strings (e.g., insulator string 115) may fail either mechanically or electrically. Mechanical failures may be the result of physical damage to the "bells" or "core" of insulator string 115. Electrical failures may be the result of contamination and tracking that can be detected via corona or electromagnetic disruptions (e.g., like static on an AM radio). Accordingly, embodiments of the invention may use devices that measure corona or partial discharge that may detect insulator tracking. Consequently, the electromagnetic profile of insulator string 115 may be periodically analyzed by insulator electromagnetic transducer 270, power line monitor 105, or SCADA 400 to see if the corona or electromagnetic disruptions of insulator string 115 is greater than acceptable levels or significantly different than an electromagnetic profile taken at a previous time (e.g., when the power line including structure 102 was first constructed).

Once power line monitor 105 (or SCADA 400) analyzes the collected plurality of status data in stage 520, method 500 may continue to stage 530 where power line monitor 105 (or SCADA 400) may display results of the collected data analysis. The results may indicate that the one of the collected plurality of status data is outside of the normal operation range for the one of the plurality of components corresponding to the one of the collected plurality of status data as described above. For example, if embodiments of the invention show that sag is increasing beyond that expected for the electrical load on the conductor and that the weather conditions are present for ice, then the analysis may indicate that ice loading conditions may be present on the power line causing the sag. If however, the sag is increasing beyond that expected for the electrical load on the conductor and the weather conditions are not present for ice, then the analysis may indicate that some other condition is present that is causing the excessive sag. Furthermore, the display may show a profile of a given span of conductor. On this profile, two horizontal lines may respectively indicate an upper safe limit and a lower safe limit of the sag. After power line monitor 105 displays the results at stage 530, method 500 may then end at stage 540.

Embodiment of the present invention may, for example, be implemented using a memory, a processing unit, and other components. Any suitable combination of hardware, software, and/or firmware may be used to implement the memory, processing unit, or other components. The processing unit may implement program modules. Generally, consistent with embodiments of the invention, program modules may include routines, programs, components, data structures, and other types of structures that perform particular tasks or implement particular abstract data types.

Moreover, embodiments of the invention may be practiced with other computer system configurations, including hand-held devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the invention, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention are described above with reference to block diagrams and/or operational illustrations of methods, systems, and computer program products according to embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

While certain features and embodiments of the invention have been described, other embodiments of the invention may exist. Furthermore, although embodiments of the present invention have been described as being associated with data stored in memory and other storage mediums, aspects can also be stored on or read from other types of computer-readable media, such as secondary storage devices, like hard disks, floppy disks, or a CD-ROM, a carrier wave from the Internet, or other forms of RAM or ROM. Further, the steps of the disclosed methods may be modified in any manner, including by reordering stages and/or inserting or deleting stages, without departing from the principles of the invention.

While certain embodiments of the invention have been described, other embodiments may exist. While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A method of providing monitoring, the method comprising:
   receiving a first distance between a first sag transceiver and a second sag transceiver comprising a first distance, wherein receiving the first distance between the first sag transceiver and the second sag transceiver comprises;
      receiving a time stamped signal at the second transceiver from the first transceiver, the time stamped signal comprising a time stamp indicating a time when the time stamped signal left the first transceiver,
      determining a time of receipt of the time stamped signal at the second transceiver, and
      determining the first distance based on the time stamp on the received time stamped signal and the time of receipt of the time stamped signal;
   receiving a second distance between the first sag transceiver and a third sag transceiver;
   receiving a third distance between the second sag transceiver and the third sag transceiver;
   calculating a current location of a point on a span of conductor based upon the first distance, the second distance, and the third distance, wherein the first sag transceiver, the second sag transceiver, and the third sag transceiver are located on the span;
   calculating a sag of the span of conductor based upon the calculated current location of the point on the span of conductor and a previous location of the point on the span of conductor, wherein calculating the sag comprises calculating a real-time sag;
   determining a clearance between the span of conductor based on the calculated sag and a baseline data; and
   providing an alert when the clearance is less than a predetermined value, wherein the predetermined value is based on one or more safety codes.

2. The method of claim 1, wherein receiving the second distance between the first sag transceiver and the third sag transceiver comprises determining the second distance based upon a signal transmitted between the first sag transceiver and the third sag transceiver.

3. The method of claim 1, wherein receiving the third distance between the second sag transceiver and the third sag transceiver comprises determining the third distance based upon a signal transmitted between the second sag transceiver and the third sag transceiver.

4. The method of claim 1, wherein calculating the current location of the point comprises calculating the current location of the point being within the third sag transceiver.

5. The method of claim 1, wherein receiving the first distance between the first sag transceiver and the second sag transceiver comprises receiving the distance between the first sag transceiver and the second sag transceiver wherein the first sag transceiver is located on a first structure supporting a first end of the span.

6. The method of claim 1, wherein receiving the first distance between the first sag transceiver and the second sag transceiver comprises receiving the distance between the first sag transceiver and the second sag transceiver wherein the second sag transceiver is located on a second structure supporting a second end of the span.

7. The method of claim 1, wherein receiving the second distance between the first sag transceiver and the third sag transceiver comprises receiving the distance between the first sag transceiver and the third sag transceiver located at the point on the span.

8. The method of claim 1, wherein calculating the current location of the point on the span of conductor comprises calculating at one of the following: the first sag transceiver, the second sag transceiver, and the third sag transceiver.

9. The method of claim 1, wherein calculating the current location of the point on the span of conductor comprises calculating at a power line monitor.

10. The method of claim 1, further comprising providing the alert when the calculated sag is outside of a predetermined range for the span.

11. The method of claim 1, wherein calculating the sag of the span of conductor based upon the calculated current location of the point on the span of conductor and the previous location of the point on the span of conductor comprises calculating the sag wherein the previous location of the point on the span of conductor provides a baseline reference for ground clearance for the span of conductor.

12. A system for providing monitoring, the system comprising:
   a power line monitor configured to collect first data corresponding to the following:

a first distance between a first sag transceiver and a second sag transceiver comprising a first distance, wherein power line monitor being configured to collect the first distance comprises the power line monitor being configured to: receive a time stamped signal at the second transceiver from the first transceiver, the time stamped signal comprising a time stamp indicating a time when the time stamped signal left the first transceiver, determine a time of receipt of the time stamped signal at the second transceiver, and determine the first distance based on the time stamp on the received time stamped signal and the time of receipt of the time stamped signal, a second distance between the first sag transceiver and a third sag transceiver comprising a second distance, and a third distance between the second sag transceiver and the third sag transceiver comprising a third distance; and a supervisory control and data acquisition (SCADA) system configured to;

receive a first data from the power line monitor, calculate a current location of a point on a span of conductor based upon the first distance, the second distance, and the third distance received in the first data, wherein the first sag transceiver, the second sag transceiver, and the third sag transceiver are located on the span, calculate a first real-time sag of the span of conductor based upon the current location of the point on the span of conductor, provide an alert when the calculated first real-time sag is outside of a predetermined range for the span, receive second data from the power line monitor, recalculate the current location of the point based upon the second data, calculate a second real-time sag for the span of conductor based upon the recalculated current location, determine, based on the first real-time sag and the second real-time sag, that a real-time sag for the span of the conductor has increased, determine whether the increase in the real-time sag for the span of the conductor is beyond that expected of an electrical load on the conductor, determine, based on the determination that the increase in the real-time sag on the span of the conductor is beyond that expected of the electrical load, a probable cause for the increase in the real-time sag;

determine a clearance between the span of conductor based on the real-time sag and a baseline data; and provide an alert when the clearance is less than a predetermined value, wherein the predetermined value is based on one or more safety codes.

13. The system of claim 12, wherein the power line monitor is configured to collect the data corresponding to the current location of the point on the span of conductor from a plurality of sag transceivers.

14. The system of claim 12, wherein the power line monitor is configured to collect the data corresponding to a current angle of the section of the span of conductor from at least one inclinometer.

* * * * *